(12) United States Patent
Kuckes et al.

(10) Patent No.: US 11,299,979 B2
(45) Date of Patent: Apr. 12, 2022

(54) MAGNETIC DISTANCE AND DIRECTION MEASUREMENTS FROM A FIRST BOREHOLE TO A SECOND BOREHOLE

(71) Applicant: Vector Magnetics LLC, Ithaca, NY (US)

(72) Inventors: Arthur F. Kuckes, Ithaca, NY (US); Rahn Pitzer, Ithaca, NY (US); David Mohler, Ithaca, NY (US); Mariano S Garcia, Ithaca, NY (US)

(73) Assignee: VECTOR MAGNETICS, LLC, Ithaca, NY (US)

(*) Notice: Subject to any disclaimer, the term of this patent is extended or adjusted under 35 U.S.C. 154(b) by 92 days.

(21) Appl. No.: 16/815,495

(22) Filed: Mar. 11, 2020

(65) Prior Publication Data
US 2020/0291766 A1   Sep. 17, 2020

Related U.S. Application Data

(60) Provisional application No. 62/816,665, filed on Mar. 11, 2019.

(51) Int. Cl.
*G01V 3/00* (2006.01)
*E21B 47/0228* (2012.01)
(Continued)

(52) U.S. Cl.
CPC ...... *E21B 47/0228* (2020.05); *G01R 33/0206* (2013.01); *G01V 3/18* (2013.01);
(Continued)

(58) Field of Classification Search
CPC ... G01V 3/26; G01V 3/28; G01V 3/18; G01V 3/30; E21B 47/0228; E21B 47/022;
(Continued)

(56) References Cited

U.S. PATENT DOCUMENTS

| 2006/0131013 A1* | 6/2006 | McElhinney | ....... E21B 47/0228 166/250.01 |
| 2009/0201025 A1* | 8/2009 | McElhinney | ....... E21B 47/0228 324/346 |

(Continued)

*Primary Examiner* — Raul J Rios Russo
(74) *Attorney, Agent, or Firm* — Brown & Michaels, PC

(57) ABSTRACT

Determining distance and direction from a first borehole to a second borehole including generating a time-varying magnetic field by axially reciprocating magnets of opposed polarity, at a first location in a second borehole, and detectable in the region of the first borehole. First and second sensors positioned at an observation point in the first borehole measure the amplitude and relative phase of components of the magnetic field. From these measurements, the direction, relative to the sensors, from an observation point to the first location is determined. The distance between these points is determined by measuring amplitude variations with depth of the magnetic field at observation points in the first borehole and computing theoretical variations in the amplitude for different assumed distances between the observation points and the location of the magnetic field source which are compared with theoretical variations to determine the distance between the first and second boreholes.

15 Claims, 10 Drawing Sheets

(51) Int. Cl.
*G01R 33/02* (2006.01)
*G01V 3/18* (2006.01)
*G01V 3/26* (2006.01)
*G01V 3/28* (2006.01)
*G01V 3/30* (2006.01)
*E21B 47/022* (2012.01)
*E21B 47/092* (2012.01)
*E21B 49/00* (2006.01)

(52) U.S. Cl.
CPC ............... *G01V 3/26* (2013.01); *G01V 3/28* (2013.01); *G01V 3/30* (2013.01); *E21B 47/022* (2013.01); *E21B 47/092* (2020.05); *E21B 49/00* (2013.01)

(58) Field of Classification Search
CPC ... E21B 47/092; E21B 49/00; G01R 33/0206; G01R 33/04
USPC ....... 324/303, 323, 331, 333, 338, 345, 346, 324/351, 376
See application file for complete search history.

(56) References Cited

U.S. PATENT DOCUMENTS

| | | | | |
|---|---|---|---|---|
| 2010/0300756 A1* | 12/2010 | Bergstrom | ............... | G01V 3/26 175/45 |
| 2012/0139530 A1* | 6/2012 | McElhinney | ....... | E21B 47/0228 324/207.13 |
| 2015/0285068 A1* | 10/2015 | Morris | .................... | E21B 49/00 324/333 |
| 2016/0091626 A1* | 3/2016 | Kostov | ................. | G01V 11/00 324/346 |

\* cited by examiner

MAGNETIC DISTANCE AND DIRECTION MEASUREMENTS FROM A FIRST BOREHOLE TO A SECOND BOREHOLE

REFERENCE TO RELATED APPLICATIONS

This application claims one or more inventions which were disclosed in Provisional Application No. 62/816,665, filed Mar. 11, 2019, entitled "MAGNETIC DISTANCE AND DIRECTION MEASUREMENTS FROM A FIRST BOREHOLE TO A SECOND BOREHOLE". The benefit under 35 USC § 119(e) of the United States provisional application is hereby claimed, and the aforementioned application is hereby incorporated herein by reference.

BACKGROUND OF THE INVENTION

Field of the Invention

The present invention is directed, in general, to a method and apparatus for surveying the path of a first borehole and monitoring the drilling path of a second borehole, and to the generation of time varying magnetic fields for use in precisely measuring the distance and direction between an existing borehole and a borehole being drilled, for the purpose of quality control, directional control and planning

Description of Related Art

Precise monitoring of the separation between one or more existing boreholes, and a new borehole being drilled is required from time to time in the mining, tunneling, quarrying and construction industries. For example, when bench drilling and quarrying, boreholes are spaced a few meters apart in a grid pattern, filled with explosive and detonated to cause the rock to collapse. The boreholes can be up to 50 or 60 meters deep, and may be prone to drift along their course due to properties of the rock being drilled, becoming closer or further apart than desired. This creates inefficiencies in blasting and removal of the subsequent rubble. By monitoring the separation of boreholes, adjustments can be made to the drilling process to maintain the desired separation with depth. Explosive charges may also be adjusted to compensate for variations in separation.

Another example is found in tunnel construction, where the process of forepoling is used to stabilize overburden soils prior to excavation. Multiple tubes are drilled through the overburden as an umbrella and grout is injected to fill the tubes and spaces between them. Maintaining precise separation between the tubes is necessary for complete grouting and stabilization prior to excavation.

Another example is found in underground mining where a "fan" pattern of non-parallel boreholes may be drilled to continue excavating a drift or tunnel. Precise placement of the boreholes improves the efficiency of subsequent blasting and rubble removal.

One last example is in dam constructions, where grouping is injected beneath the dam via drilled holes in order to prevent or minimize water seepage under the dam.

Conventionally, drilling of a borehole is usually carried out in fixed length increments, the increment being defined by the length of the drill rod sections in that particular application. For example, in oilfield drilling, most drill rod sections are 10 meters long, and so drilling is halted every 10 meters to add a drill rod section. Output of magnetometers and inclinometers in a measuring tool of a first preexisting borehole is analyzed to determine the depth as well as the field gradient values to determine the direction and distance between the first preexisting borehole and the drill rod section or second borehole being drilled.

After measuring a sensor reading from the first previously drilled hole, drilling commences. Depending on the type of rock and length of drill rod, this operation can typically take anywhere from one to twenty minutes. During this entire period the drill stem can be maintained on a predetermined course by closely watching outputs and orientation of the "bent sub" portion of the drill stem in a manner known by those skilled in the art of directional drilling. Also during this period a measuring tool in the second borehole is held stationary and is constantly registering measurements, with a computer constantly doing the required signal averaging and the field correlations. At the end of the rod section, drilling is stopped, a borehole survey taken and a new section of drill rod is added to the stem. After the survey is completed, the measurement tool is moved ahead in the first borehole and drilling restarts. This method of measuring and moving fixed lengths at a time can contribute to inaccuracies and requires manual shifting of magnetic field sensor to drill forward, which can be time-consuming.

SUMMARY OF THE INVENTION

In an embodiment of the present invention, a drilling system allows continuous drilling of boreholes while permitting precise measurement of the distance and direction between the borehole being drilled and nearby existing boreholes.

In an embodiment of the present invention, a magnetic field source is provided near a drill bit in a borehole being drilled for use in accurate and reliable measurements of the distance and direction from the drill bit to a nearby borehole to thereby permit precise measurement of the separation between the boreholes.

In another embodiment of the present invention, an accurate survey of the path of a first borehole prior to measuring distance and direction from said first borehole to a second borehole is executed.

In another embodiment of the present invention, directional control of a drilling borehole is accomplished with an asymmetric bias of the drilling assembly resulting in drift of the borehole relative to the direction of the asymmetric bias.

In accordance with the present invention, the distance and direction from a first borehole to a second borehole is determined by locating in one borehole, preferably the borehole being drilled, a magnetic field source. This magnetic field source may be a permanent magnet mounted near the drill bit of a conventional drill string, with the north-south axis of the magnet being perpendicular to the axis of rotation of the drill, as in U.S. Pat. No. 5,589,775.

Alternatively, the magnetic field source may be two permanent magnets mounted near the drill bit in a Down-The-Hole (DTH) hammer assembly where a first magnet is mounted in fixed position in the assembly with the N-S axis of the magnet aligned with the axis of the drilling assembly and a second magnet is mounted to reciprocate with the DTH hammer piston, also with the N-S axis of the magnet aligned with the axis of the drilling assembly. The two magnets may be oriented with identical poles facing each other, either N-N or S-S, or with opposite poles facing each other, either N-S or S-N. During operation of the DTH hammer, a piston of the DTH hammer and the second magnet reciprocate relative to the first magnet, such that the change in linear displacement between the two magnets creates a time-varying magnetic field at some frequency, typically 20-40 hertz.

In yet another embodiment, a magnetic field source is provided by an electrical circuit which acts as an electromagnet which creates an electromagnetic field which rotates in the same manner as those described above.

Magnetic field sensors, preferably one or more of highly sensitive triaxial fluxgate magnetometers, are positioned at a determined observation point in the first, previously drilled borehole within the magnetic field generated by the magnetic field source in the second borehole. In a preferred embodiment of the invention, the amplitude and relative phase of first and second components (magnetometers measurements along the x and y axes of sensitivity Bx and By) of the rotating magnetic field are detected by the sensors and the direction from the observation point to the magnetic field source is determined. This direction may be determined with respect to magnetic north or with respect to a designated index or "key" of the sensor package with the key oriented in the existing previously drilled first borehole in a predetermined reference direction in order to determine the absolute direction to the borehole in which the rotating field source is located. If desired, a gyroscope may be used as a reference, with the direction to the magnetic field being determined with respect to that reference.

The distance from the observation point in the first previously drilled borehole to the location of the source in the second borehole may also be calculated, in accordance with the invention, by determining the strength of the magnetic field source and comparing that known strength with the value measured at the observation point, since the field strength is inversely proportional to the cube of the distance from the source. In a preferred embodiment, the field strength may be unknown and is determined by measuring, at plural observation points within the first borehole, amplitude variations with depth of the total magnetic field and computing theoretical variations in the amplitude for different assumed distances between the two boreholes. Thereafter, a measured amplitude is compared with the computed values to determine the distance. This computation may also be used to determine the effective strength of the magnetic field source, and thereafter that calculated effective strength can be used directly in further determinations of distance by simply measuring the amplitude of the magnetic field at the observation point.

In a preferred embodiment of the invention, an array of triaxial sensors spaced axially along the length of a borehole at predetermined separation and orientation to the reference key may be placed in the first previously drilled borehole, as a rigid assembly with the purpose of maintaining the reference key index from the top to the bottom of the sensor array, to continuously monitor distance and direction to the magnetic field source as drilling progresses from top to bottom. The sensors of the sensor array can record measurements while stationary or during movement. It should be noted that the movement of the sensor array can be controlled by and/or coupled to the drilling machine.

In deeper boreholes, for ease of handling, the sensors will be contained in multiple sections of an assembly of a sensor array, and the orientation of the reference key will be maintained from surface to the maximum depth of the first previously drilled borehole, typically no more than 50-60 meters, through oriented connections of the rigid assembly, or otherwise determined during assembly of the array of sensors, which orientation value will be used to adjust all sensors in the array to a common reference index. One way to position the sensor array is to embed the sensors in tubing that is rigid enough to be pushed into the first borehole. This allows for the sensor array to be placed not only in a downward oriented borehole, as is typical in quarrying, but also in an upward oriented borehole, as might be found in underground drilling. Orientation of the magnetic sensors with respect to vertical in the first borehole will be measured by gravity sensors, typically inclinometers or accelerometers, of known orientation to the reference key and the magnetic sensors. Integration of deviation from vertical in both magnitude and direction from the reference key will produce an accurate map or survey of the subsurface path of the first previously drilled borehole.

In another embodiment of the invention, multiple sets of spaced triaxial component magnetic field sensors may be provided in the first borehole to measure the axial field gradient of the rotating magnetic field. This field gradient provides an indication of whether the observation point is approximately coplanar to the rotating magnet, and thus provides a measure of their relative depths. This field gradient can also be used to determine the effective strength of the field source for obtaining direct measurements of radial distance between the rotating magnet and the sensor at the observation point.

In an embodiment, a method for determining a direction from a magnetic field source in a second bore hole relative to at least one previously drilled borehole is disclosed. In a first step, a computer of the drilling machine, separate machinery, or integrated into the sensor array, based on a distance from the surface to a bottom of at least one previously drilled borehole, determines a sensor array to be placed into the at least one previously drilled bore hole. The sensor array includes triaxial magnetic sensors and triaxial or biaxial gravity sensors spaced apart a known distance. A reference key can be used relative to the sensor array. Next, the computer receives magnetic field measurements from the sensors of the sensor array in at least one previously drilled borehole relative to a magnetic field source in the second borehole being drilled. Based on the magnetic field measurements, the computer determines the strength of the magnetic field source at each of the sensors within the array and continuously determines a position of the magnetic field source relative to the sensors of the sensor array.

BRIEF DESCRIPTION OF THE DRAWING

FIG. 8b shows a top down view of FIG. 8a

DETAILED DESCRIPTION OF THE INVENTION

Figure 1A:
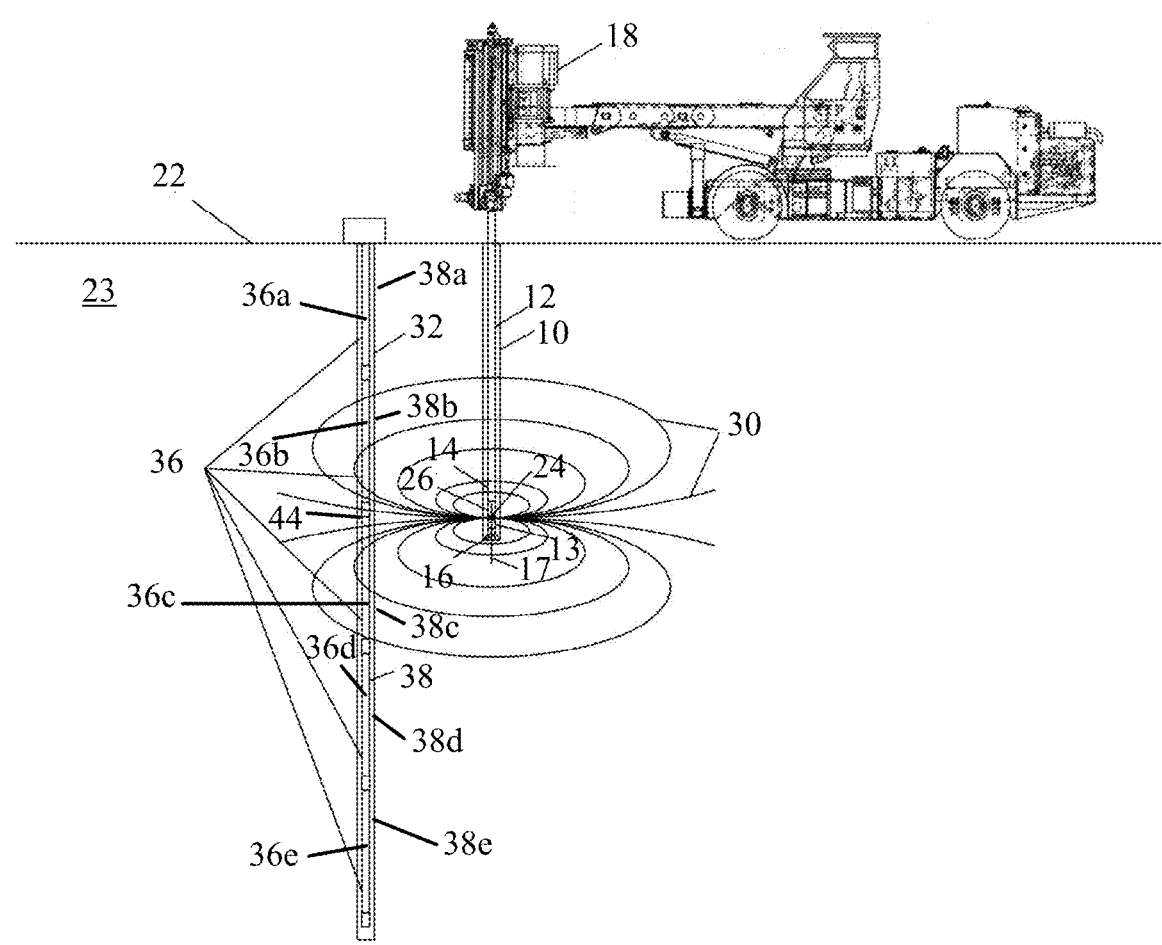
FIG. 1a shows a pair of vertical, spaced boreholes in which the measuring system of the present invention is utilized for guiding a rotating drill bit carried on a drill string located in a borehole being drilled.
Figure 1B:
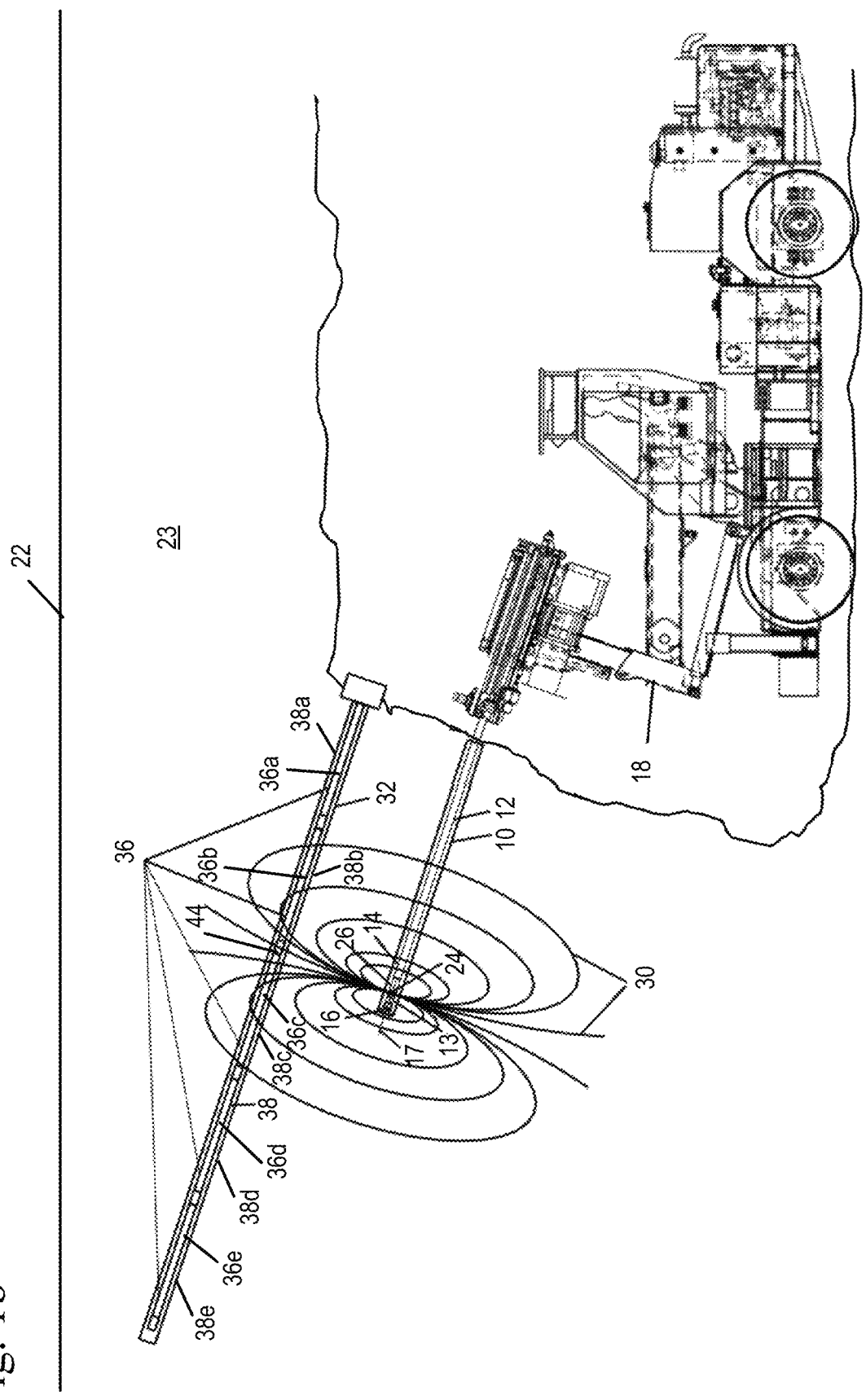
FIG. 1b shows a pair of non-vertical, spaced boreholes in an underground environment in which the measuring system of the present invention is utilized for guiding a rotating drill bit carried on a drill string located in a borehole being drilled.

FIGS. 1a and 1b diagrammatically illustrates the method and apparatus used, in accordance with the present invention, for guiding directional drilling of a second borehole 10 to achieve precisely controlled separation with respect to a first, previously drilled borehole 32. Thus, in FIGS. 1a and 1b, a second borehole 10 contains a drill string 12 incorporating a drill assembly generally indicated at 14. The drill assembly 14 includes a drill bit 16 which is driven rotationally and has axial force applied by a drilling machine 18, located at the surface 22 of the Earth 23, as in FIG. 1a, or underground or beneath the surface 22 of the Earth 23 as in FIG. 1b, to rotate about a longitudinal axis of rotation 17 and typically incorporating either a pneumatic top hammer in the drilling machine 18 or a pneumatic Down-The-Hole (DTH) Hammer 13 (see FIG. 2).

In accordance with an embodiment, an elliptically polarized rotating magnetic field is generated in, and is centered in, the second borehole 10 being drilled. For this purpose, the drill assembly 14 carries a magnetic field source 24 such as at least one permanent bar magnet mounted in a non-magnetic section of drill pipe 26 located just behind the rotating drill bit 16. A set of multiple bar magnets in parallel can be used which act as a single permanent bar magnet to increase the strength of the magnet. The magnetic field source 24 is carried by the drill string 12 with north-south axes of the at least one permanent magnet being perpendicular to the axis of rotation 17 of the drill bit 16. The at least one permanent bar magnet of the magnetic field source 24 generates an elliptically polarized magnetic field generally indicated by the magnetic field lines 30, with the rotation of the at least one permanent bar magnet of the magnetic field source 24 about the longitudinal axis of rotation 17 producing an alternating magnetic field at an observation point 44 radially spaced from the at least one permanent bar magnet of the magnetic field source 24.

Figure 2B:
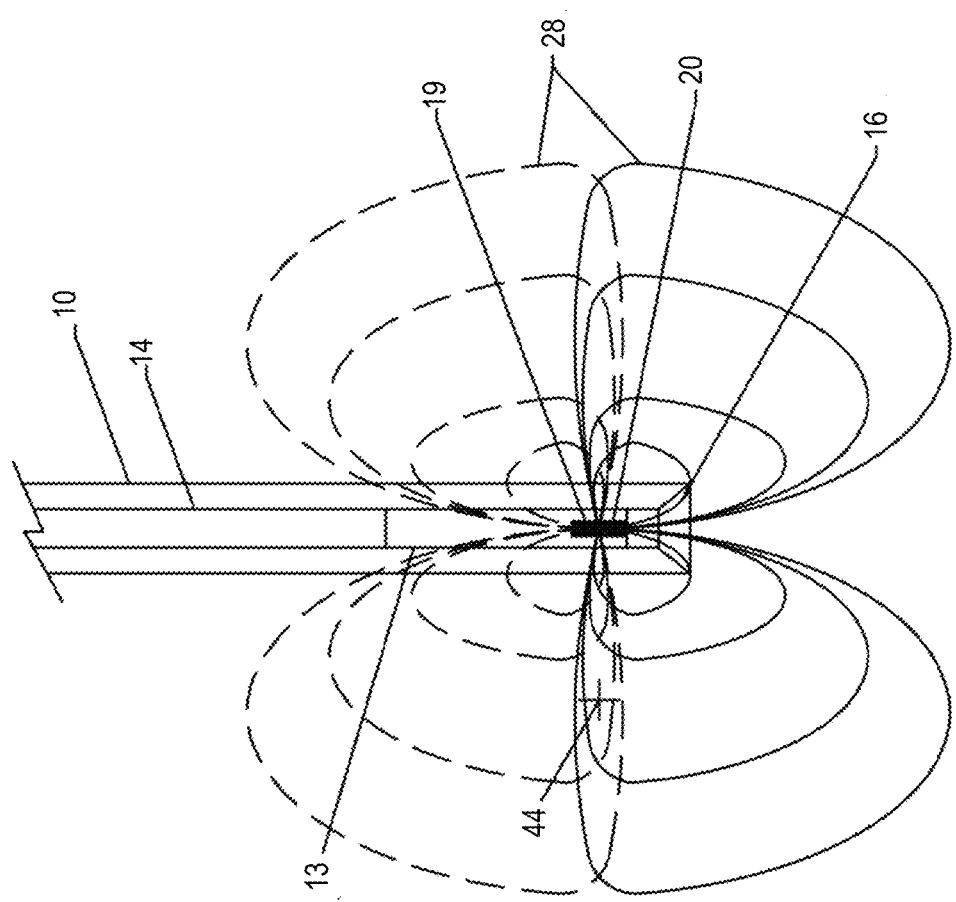
FIG. 2b shows a diagrammatic illustration of the direction and strength of a magnetic field at a least separation distance produced by a reciprocating magnetic field source as might be installed in a Down-The-Hole hammer drilling device carried by the drill string of FIG. 1.
Figure 2A:
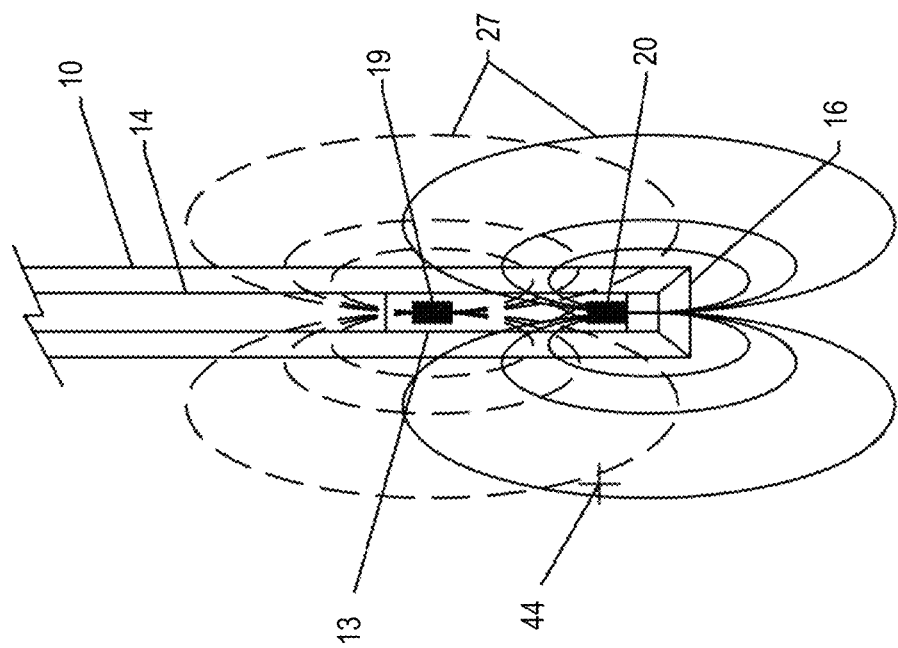
FIG. 2a shows a diagrammatic illustration of the direction and strength of a magnetic field at a greatest separation distance produced by a reciprocating magnetic field source as might be installed in a Down-The-Hole hammer drilling device carried by the drill string of FIG. 1.

FIGS. 2a and 2b are schematic representations of a preferred embodiment of a reciprocating magnetic field source 24. Drilling second borehole 10 contains drill assembly 14, drill bit 16, DTH hammer 13 and reciprocating permanent bar magnets 19 and 20. It should be noted that while two reciprocating permanent bar magnets 19, 20 are discussed, multiple sets of two reciprocating permanent bar magnets can also be used. The poles of magnets 19 are 20 are oriented axially to the drill string 12 and opposite to each other such that a first magnet's 19 south pole faces a second magnet's 20 south pole or the first magnet's 19 north pole faces the second magnet's 20 north pole. Additionally, the magnets 19, 20 are integral to the DTH hammer 13 or other device constructed of non-magnetic material such that they reciprocate axially relative to each other, repetitively moving closer and farther apart. This axial reciprocation is powered by a pressurized fluid pumped down the drill assembly 16 to remove drill cuttings and to operate the DTH hammer 13.

The magnetic field lines 27 of FIG. 2a are representative of when the first and second magnets 19 and 20 are at their greatest separation and the magnetic field lines 28 of FIG. 2b are representative of when the first and second magnets 19 and 20 are at their least separation. When the first and second magnets 19, 20 are at their greatest separation, the magnetic field at observation point 44 consists of components both radial from and parallel to the drill assembly 14. When the first and second magnets 19 and 20 are at their least separation, there is a large increase in the magnitude of the radial magnetic field at observation point 44. The reciprocating field source produces a time-varying magnetic field detected by sensors My, Mx, Mz, of the sensor array 36 in the nearby, previously first drilled borehole 32. The amplitude of the components of the reciprocating magnetic field are measured by the sensors My, Mx, Mz of the sensory array 36 and the direction from the observation point 44 to the magnetic field source 24 is determined by measuring, at a plurality of observation points within the previously first drilled borehole 32, amplitude variations with depth of the total magnetic field and computing theoretical variations in the amplitude for different assumed distances between the two boreholes 10, 32. This computation may also be used to determine the effective strength of the magnetic field source 24, and thereafter that calculated effective strength can be used directly in further determinations of distance by simply measuring the amplitude of the magnetic field at the observation point. The distance from the observation point in the previously first drilled borehole 32 to the location of the magnetic field source 24 in the second borehole 10 may also be calculated, in accordance with the invention, by determining the strength of the magnetic field source and comparing that known strength with the value measured at the observation point, since the field strength is inversely proportional to the cube of the distance from the source.

Additional embodiments of a reciprocating magnetic field source may include two axially aligned magnets oriented with opposite poles facing each other and reciprocating to create a time-varying magnetic field or a single magnet axially aligned with the drilling assembly and reciprocating to create a time-varying magnetic field.

Alternatively, an entire piece of the drill assembly 14 may be magnetized during or after the manufacturing process of the drill assembly 14, such as the drill bit 16 or drill rod section removing the need to have magnets placed within the drill assembly 14.

An existing, previously first drilled borehole 32 is illustrated in FIGS. 1a and 1b. In accordance with one example of the present invention, the drill bit 16 is controlled so that the second borehole 10 is drilled at a calculated trajectory with respect to previously, first drilled borehole 32 and is spaced from the second borehole 10 by a predetermined, distance at each depth increment. Control of the drill bit 16 is carried out in response to measurements made in the first previously drilled borehole 32 by means of a sensor array 36 of comprised of a plurality of sensor array segments 36a-36e, with each segment 36a-36e including at least a triaxial magnetic field sensor My,Mx, Mz (see FIG. 3) and a bidirectional or triaxial gravity sensor Gx, Gy, Gz (see FIG. 3) and corresponding to measuring tool sections 38a-38e of a measuring tool 38.

The measuring tool sections 38a-38e space the sensors My,Mx, Mz, Gy, Gz, Gx of the sensor array 36 along the length or distance of the first previously drilled borehole 32 as desired. As the drilling of the second borehole 10 progresses, the magnetic field source 24 sequentially passes the one or more sensors My,Mx, Mz, Gy, Gz, Gx of the sensor array 36 and measurements of magnetic field strength and direction are continuously transmitted and processed to the drilling machine 18 for determination of distance and direction from the first, previously drilled borehole 32 to the second borehole 10.

Figure 3:
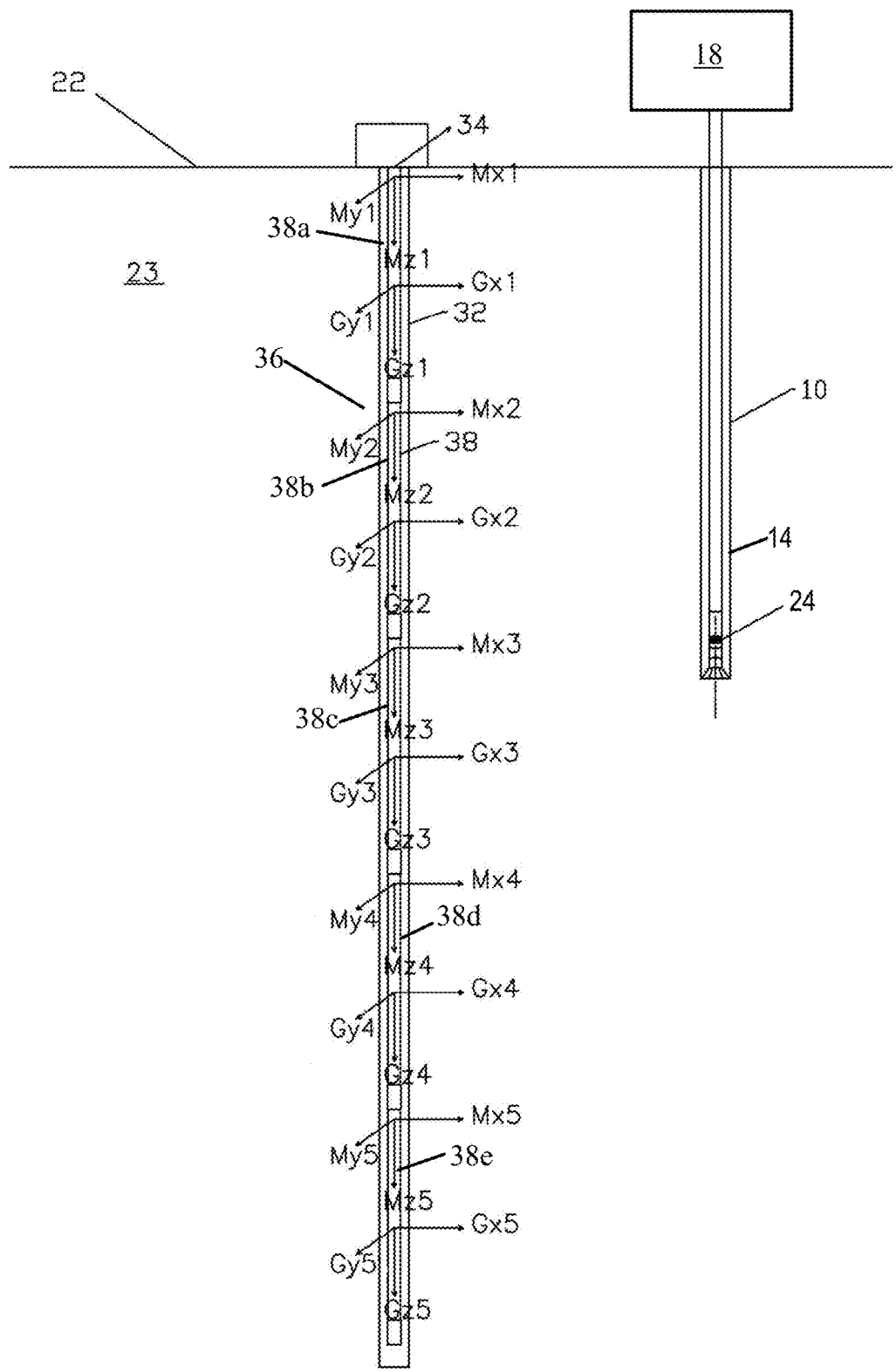
FIG. 3 illustrates a sensor configuration in a first borehole for surveying the path of the first previously drilled borehole and for continuously measuring the path of a second borehole being drilled.

A plurality of magnetic field sensors My,Mx, Mz are located at different known points in the sensor array 36 of the previously first drilled borehole 32 per a reference key 34 attached to the sensor array 36 (see FIG. 3).

FIG. 3 is a schematic of a measuring tool or tool enclosure 38 for use in near vertical drilling such as bench drilling and blasting for quarrying and mining, containing a sensor array 36 consisting of a plurality of tri-axial magnetic Mx, My, Mz and tri-axial gravity Gx, Gy, Gz or bi-axial gravity Gx and Gy sensors installed in an existing first borehole 32 along different sections 38a-38e of the measuring tool or tool enclosure 38.

To accurately map the location of the second borehole 10 relative to a larger mine-wide coordinate system containing many boreholes, the path of the previously first drilled borehole 32 must also be accurately known. The plurality of triaxial sensors Mx, My, Mz, Gx, Gy Gz or bi-axial sensors Gx, Gy of the sensor array 36 within the sections of the measuring tool 38 identify the drift angle magnitude and direction relative to the key 34 along the length of the previously first drilled borehole 32. Well known borehole survey calculation methods such as Average Angle, Tangential or Minimum Curvature can be used to map the location of the previously drilled borehole 32 relative to the mine-wide coordinate system.

In the case of horizontal or nearly horizontal drilling, the gravity sensors Gx, Gy, Gz of the measuring tool 38 and reference key 34 alone cannot determine the drift direction of the existing previously first drilled borehole 32. An additional independent directional measurement using a magnetic compass or gyro compass is required, and may be incorporated in measuring tool 38 for near-horizontal drilling applications.

Figure 7:
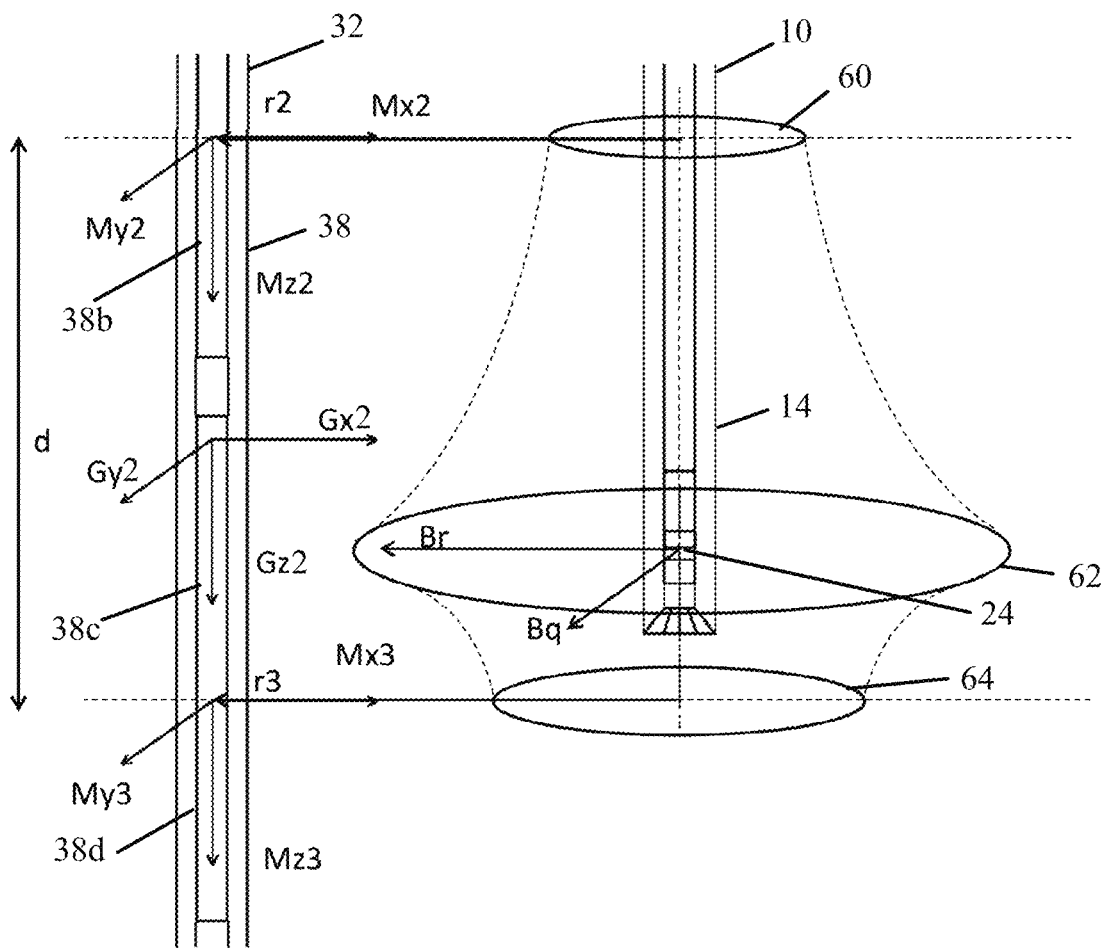
FIG. 7 is a schematic representation illustrating the relationship between the rotating magnetic field source in one borehole and multiple sensors in a second borehole positioned with x-y planes of sensitivity not coplanar with the source.

FIG. 7 is a schematic representation illustrating the relationship between the rotating magnetic field source in one borehole and multiple sensors in a second borehole positioned with x-y planes of sensitivity not coplanar with the source signal.

With multiple sensors My, Mx, Mz, Gy, Gz, Gx being used, which are separated by a known distance d, redundant sensor measurements can be used to increase accuracy. The distance from sensors to borehole 10 can be determined by determining the distance of sections 38a-38e of the measurement tool 38 of the sensory array 36. In the example shown in FIG. 7, a portion of the sensory array 36 and the measurement tool 38 including triaxial magnetometer sensors My2, Mx2, Mz2, My3, Mx3, Mz3 and gravity sensors Gy2, Gx2, Gz2 are shown. The triaxial magnetometer sensors My2, Mx2, Mz2, My3, Mx3, Mz3 are both able to simultaneously detect and analyze the magnetic field source 24 in the second borehole 10. The effective magnetic moment in the x-y plane of the magnetometers Mx2, My2 is indicated by the reference number 60 and corresponds to the planar distance r2. The effective magnetic moment in the x-y plane of the magnetometers Mx3, My3 is indicated by the reference number 64 and corresponds to planar distance r3. The plane of magnetic moment sweep which has the greatest x-y magnitude is indicated by reference number 62 and Br, Bq. Because they are closer to the magnetic moment, the magnetometers Mx3, My3 detect a higher amplitude than magnetometers Mx2, My2. However, the additional measurements provided by magnetometers Mx2, My2 along with Mz2 can be used to enhance the calculation associated with the second borehole 10 orientation by utilizing, for example a weighted average of calculated position corresponding to field strength. It should be noted that signal strength ellipses and dimensions are not shown to scale and r2 need not be equal to r3.

In an alternate embodiment, while a plurality of sensors My, Mx, Mz, Gx, Gy, Gz of the sensor array 36 are shown along the entire length of the previously first drilled borehole 32, a smaller number of sensors can be used and moved a specific distance relative to time passed associated with the drilling of the second bore hole 10. In yet another embodiment, the number of sensors can be reduced along the entire length of the previously first drilled borehole 32.

Figure 8A:
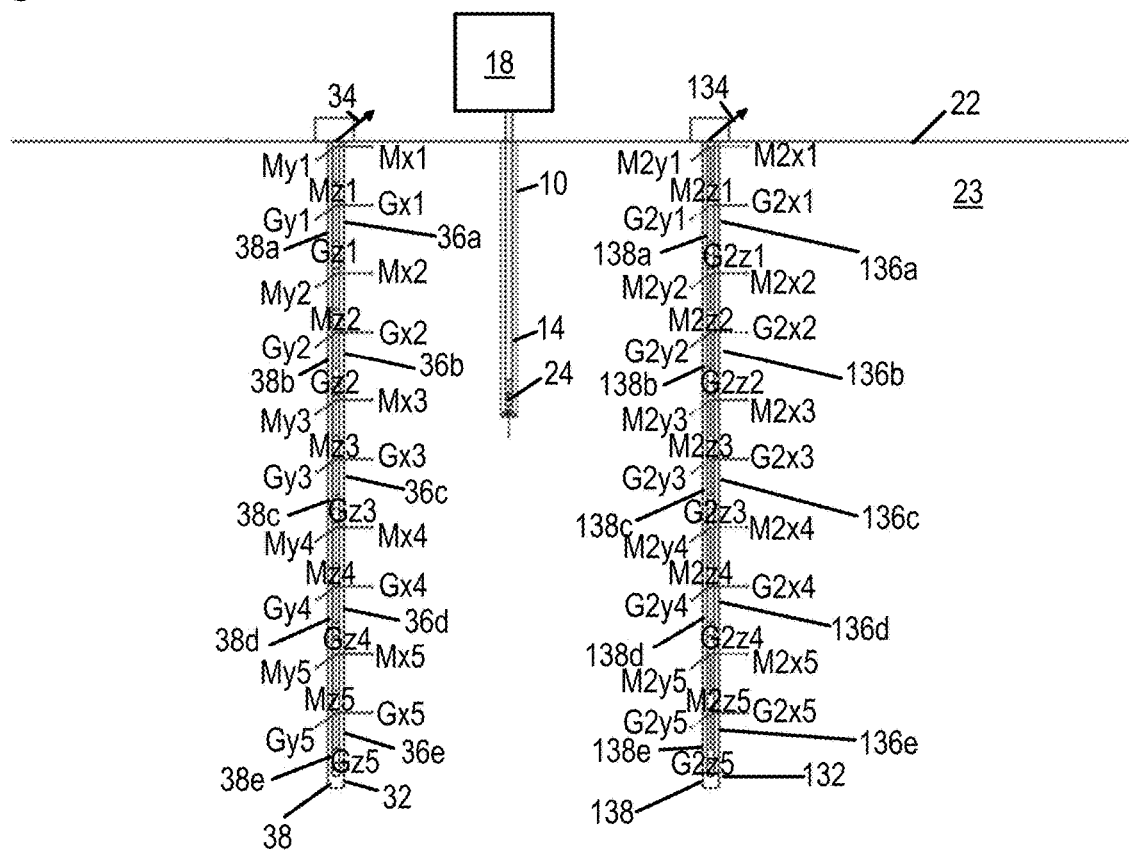
FIG. 8a illustrates a sensor configuration in a first previously drilled borehole and a third previously drilled borehole for surveying the path of the first and third previously drilled borehole and for continuously measuring the path of a second borehole being drilled.
Figure 8B:
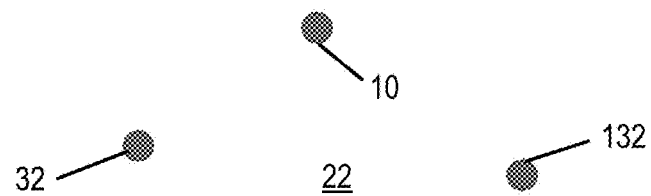
Figure 9:
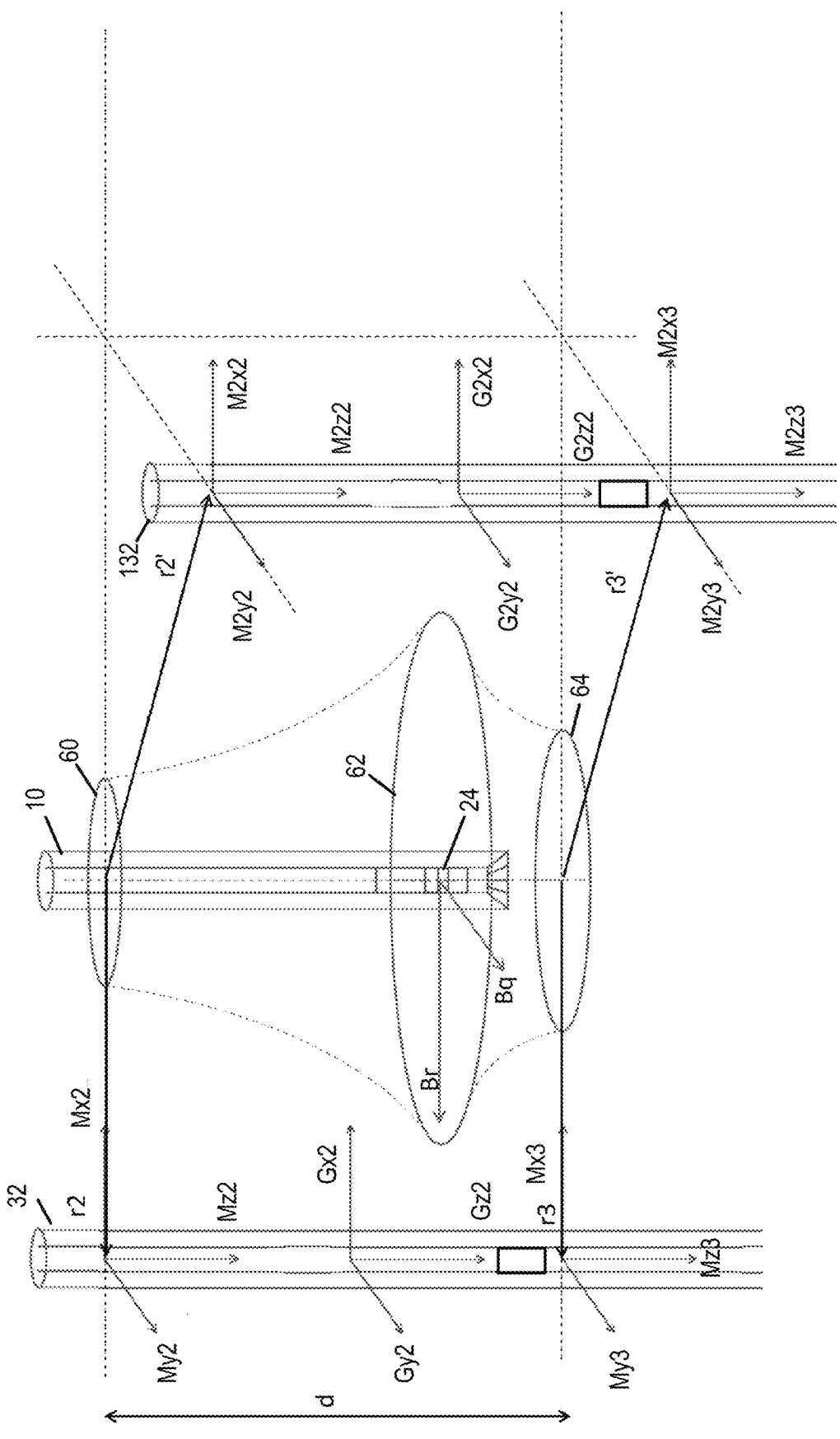
FIG. 9 shows a schematic sectional view of FIG. 8a illustrating the relationship between the rotating magnetic field source in one borehole and multiple sensors in a second and third boreholes utilizing triangulation, with the sensors shown with x-y planes of sensitivity not coplanar with the source.

FIGS. 8a-9 illustrates a sensor configuration in a first previously drilled borehole and a third previously drilled borehole for surveying the path of the first and third previously drilled borehole and for continuously measuring the path of a second borehole being drilled.

In this embodiment, two previously drilled boreholes 32, 132 can both be used to triangulate the position of the hole 10 being drilled relative to the magnetic field source 24. Each of the two previously drilled boreholes 32, 132 each contain a sensor array 36, 136 with a plurality of tri-axial magnetic Mx, M2x, My, M2y, Mz, M2z and tri-axial gravity Gx, G2x, Gy, G2y, Gz, G2z or bi-axial gravity Gx, G2x, G2y, and Gy sensors installed in existing boreholes 32, 132 along different sections 38a-38e, 138a-138e of the measuring tool 38, 138, which are separated by a known distance d, redundant sensor measurements can be used to increase accuracy. The distance can be determined by determining the distance of sections 38a-38e, 138a-138e of the measurement tool 38, 138 of the sensory array 36, 136.

As borehole 10 is being drilled with the drilling assembly 14 of a drilling machine 18 containing a magnetic source 24 as previously described, the sensor array 36, 136 of magnetic and gravity sensors My, M2y, M2x, M2z, Mx, Mz, Gy, G2y, G2x, G2z, Gz, Gx continuously measures distance and direction from existing, previously drilled boreholes 32, 132 to the magnetic source 24. All of the magnetic and gravity sensors My, M2y, M2x, M2z, Mx, Mz, Gy, G2y, G2x, G2z, Gz, Gx are of known orientation to a designated index or key 34, 134 of the measuring tool 38, 138 which in turn is oriented to a known directional reference. Torsional rigidity of the measuring tool or tool enclosure 38, 138 maintains orientation of the individual sensors of the sensor array 36, 136 in segments 36a-36e, 136a-136e relative to the key 34, 134.

To accurately map the location of the borehole 10 being drilled relative to a larger mine-wide coordinate system containing many boreholes, the path of two previously drilled borehole 32, 132 must also be accurately known. The plurality of tri-axial My, M2y, M2x, M2z, Mx, Mz, Gy, G2y, G2x, G2z, Gz, Gx or bi-axial gravity Gx, Gy, G2x, G2y sensors of the sensory array 36, 136 within the sections of the measuring tool 38, 138 identify the drift angle magnitude and direction relative to the key 34, 134 along the length of the previously drilled boreholes 32, 132.

In the example shown in FIG. 9, a portion of the sensory array 36, 136 and the measurement tool 38, 138 including triaxial magnetometer sensors My3, My2, Mx2, Mz2 M2y2, M2x2, M2z2, M2y3, M2z3, M2x3, M2x2, M2y2, M2z2, Mx3, Mz3 and gravity sensors Gy2, Gx2, Gz2, G2y2, G2z2, G2x2 are shown. The triaxial magnetometer sensors My3, My2, Mx2, Mz2 M2y2, M2x2, M2z2, M2y3, M2z3, M2x3, M2x2, M2y2, M2z2, Mx3, Mz3 and gravity sensors Gy2, Gx2, Gz2, G2y2, G2z2, G2x2 are both able to simultaneously detect and analyze the magnetic field source 24 in the second borehole 10. The magnetic moment in the x-y plane of the magnetometers Mx2, My2, M2x2, M2y2 is indicated by the reference number 60 and r2, r2'. The magnetic moment in the x-y plane of the magnetometers Mx3, My3, M2x3, M2z3 is indicated by the reference number 64 and r3, r3'. The plane of magnetic moment sweep which has the greatest x-y magnitude is indicated by reference number 62 and Br, Bq. The magnetometers Mx3, My3, M2x3, M2z3 detect a higher amplitude than magnetometers Mx2, My2, M2x2, M2y2. However, the additional measurements provided by magnetometers Mx2, My2, M2x2, M2y2 can be used to enhance the calculation associated with the bore hole 10 orientation. It should be noted that signal strength ellipses and dimensions are not shown to scale and r2 need not be equal to r3, nor r2' equal to r3'.

Adding additional out-of-plane sensors M2x2, M2y2, M2z2, G2y2, G2x2, G2z2, M2x3, M2y3, M2z3 allows the use of triangulation to further increase accuracy. In this illustration, triaxial magnetometers M2x3, M2y3, M2z3, M2x2, M2y2, M2z2 in a previously drilled and surveyed borehole 132, which is not in the same plane as borehole 10 being drilled or the other previously drilled borehole 32, to simultaneously detect and analyze the magnetic field source 24. A plurality of sensors can collect data and utilize triangulation techniques as known to those skilled in the art.

In an alternate embodiment, while a plurality of sensors M2y, M2x, M2z, Mx, Mz, Gy, G2y, G2x, G2z, Gz, Gx of the sensor arrays 36, 136 are shown along the entire length of the previously drilled boreholes 32, 132, a smaller number of sensors can be used and moved a specific distance relative to time passed associated with the drilling of the second bore hole 10. In yet another embodiment, the number of sensors can be reduced along the entire length of the previously drilled boreholes 32, 132.

In one embodiment, the triaxial sensors 36 (FIG. 4) having their axes of maximum sensitivity intersecting each other at the observation point and at right angles to each other. The triaxial sensors 36 measure the amplitude and the phase of two perpendicular components of the polarized rotating magnetic field 30 which are both perpendicular to a longitudinal axis 49 of the measuring tool 38. It should be noted that in FIGS. 4 and 5, the magnet and x-y magnetometers (observation point) are coplanar, thus Mx and My readings are the only data of interest, as Mz reads 0. The measuring tool 38 can also include an orientation device for determining the orientation of the sensors 36a-36e of the sensor array 36 with respect to either the borehole or to magnetic north. Such orientation devices are well known, and may include earth's field sensors, inclinometers, and/or a gyroscope.

Directional control of borehole 10 can be accomplished with an asymmetric bias of the drilling assembly 14. Such asymmetry may be a bend in drilling assembly 14 near the bit or an asymmetry in the cutting surface of the drill bit 16, such that greater cutting force is applied to one portion of the bit due to the asymmetric bias. Rotation of the drilling assembly 14 is controlled in a variable manner by drilling machine 18 so that rotation is slowed repeatedly when the asymmetric bias is oriented to achieve a desired direction of drift. The bias of drilling assembly 14 is indexed to the magnetic field source 24, for example permanent magnet, so that the rotational orientation of the bias is continuously known to the operator of drilling machine 18 from the continuous magnetic field measurements of measuring tool 38. The rotational speed of drilling machine 18 is varied such that more hammer strokes of the DTH hammer 13 occur when the bias of drilling assembly 14 is rotationally oriented to achieve a desired direction of drift.

Figure 4:
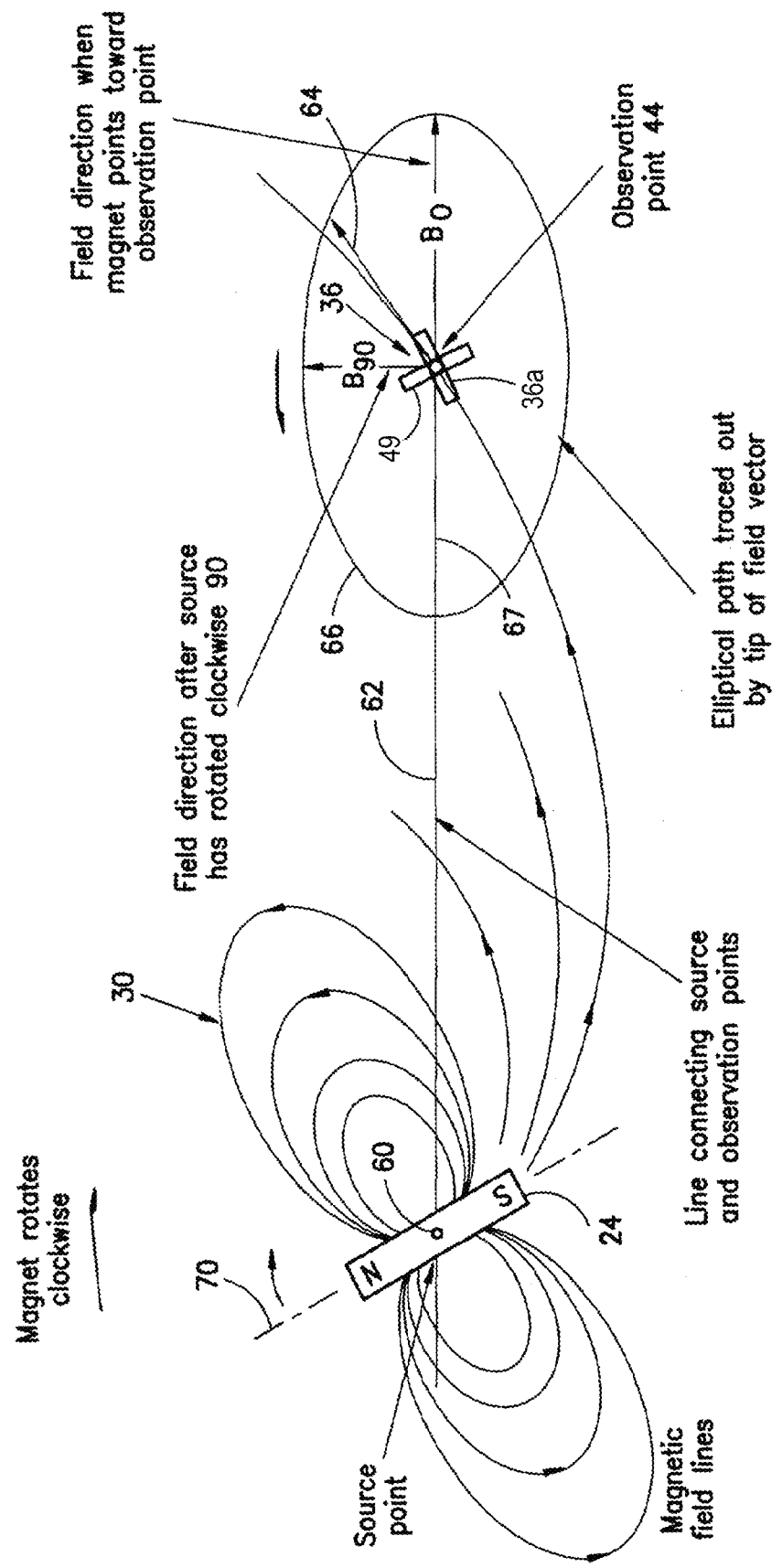
FIG. 4 is a diagrammatic illustration of the direction and strength of a magnetic field produced by a rotating magnetic field source carried by the drill string of FIG. 1.

The relationship between the rotating magnetic field source 24 and one of the plurality of sensors 36a or the sensory array 36 is illustrated in FIG. 4. As illustrated, the magnetic field source 24 may be a permanent magnet or an electromagnet rotating about a source point 60, which lies on the axis of rotation 17 of the drill bit 16 in FIG. 1a. The axis or rotation 17 is essentially parallel to the axis 49 of the measuring tool 38 which passes through the observation points. As illustrated, a magnetic field source 24, for example permanent bar magnet, may rotate in, for example, a clockwise direction, producing at the observation points variations in the direction and strength of the magnetic field indicated by the magnetic field lines 30 in synchronism with the rotation of the magnetic field source 24, for example permanent bar magnet. When the south pole of the permanent bar magnet points toward the observation points along radial line 62 joining source point 60 with observation points, the magnetic field represented by magnetic field lines 30 at the observation point is directed away from the source and is aligned with the radial line 62, as illustrated by magnetic field vector Bo. When the permanent bar magnet 24 rotates 90° clockwise, the magnetic field vector at the point of observation rotates counterclockwise by 90°, as illustrated by the vector $B_{90}$. Thus, the magnetic field vector indicated generally at 64 at the observation point rotates in a sense opposite to that of the magnetic field source 24, for example permanent bar magnet, and as the field vector rotates, its strength changes from $B_0$ to $B_{90}$, then to $B_{180}$, $B_{270}$ and back to $B_0$. The locus of the points defined by the tip of the field vector 64 follows an elliptical path 66, with the tail of the vector 64 being fixed at observation points. A magnetic field vector which rotates with temporally changing strength in this manner is said to be elliptically polarized.

The radial line 62 connecting source point 60 with observation point 44 coincides with the major axis 67 of the ellipse 66 and with the vectors $B_0$ and $B_{180}$. Since the magnetic field a fixed distance off the end of a bar magnet is twice as strong as the field at the same distance off the side of the bar magnet in the plane of rotation, the magnitude of the voltage generated by a sensor of the sensor array 36 which is aligned with the major axis of the ellipse and which thus points toward the magnetic field source 24 will be double that of a sensor of the sensor array 36 whose axis of sensitivity is perpendicular to the major axis of the ellipse. In addition, there is a time difference between the maximum field vector component measured by the sensor of the sensor array 36 aligned with the major axis and the maximum vector component measured by the sensor of the sensor array 36 in the perpendicular direction. This time difference is equal to ¼ the rotation period of the rotating vector, and thus is ¼ the rotation period of the rotating permanent bar magnet. This coincidence of the major axis of the magnetic field polarization ellipse with the direction to the source and the associated field phase and amplitude relationships constitute the physical basis for being able to evaluate the direction to the source point 60 from the observation point 44. This evaluation utilizes the amplitudes and the phase relationships of the voltages generated by the triaxial sensors 36a-36e of the sensor array 36. These triaxial sensors 36a-36e of the sensor array 36 preferably have an arbitrary orientation within the borehole 32, and thus with respect to the radial line 62.

Figure 5:
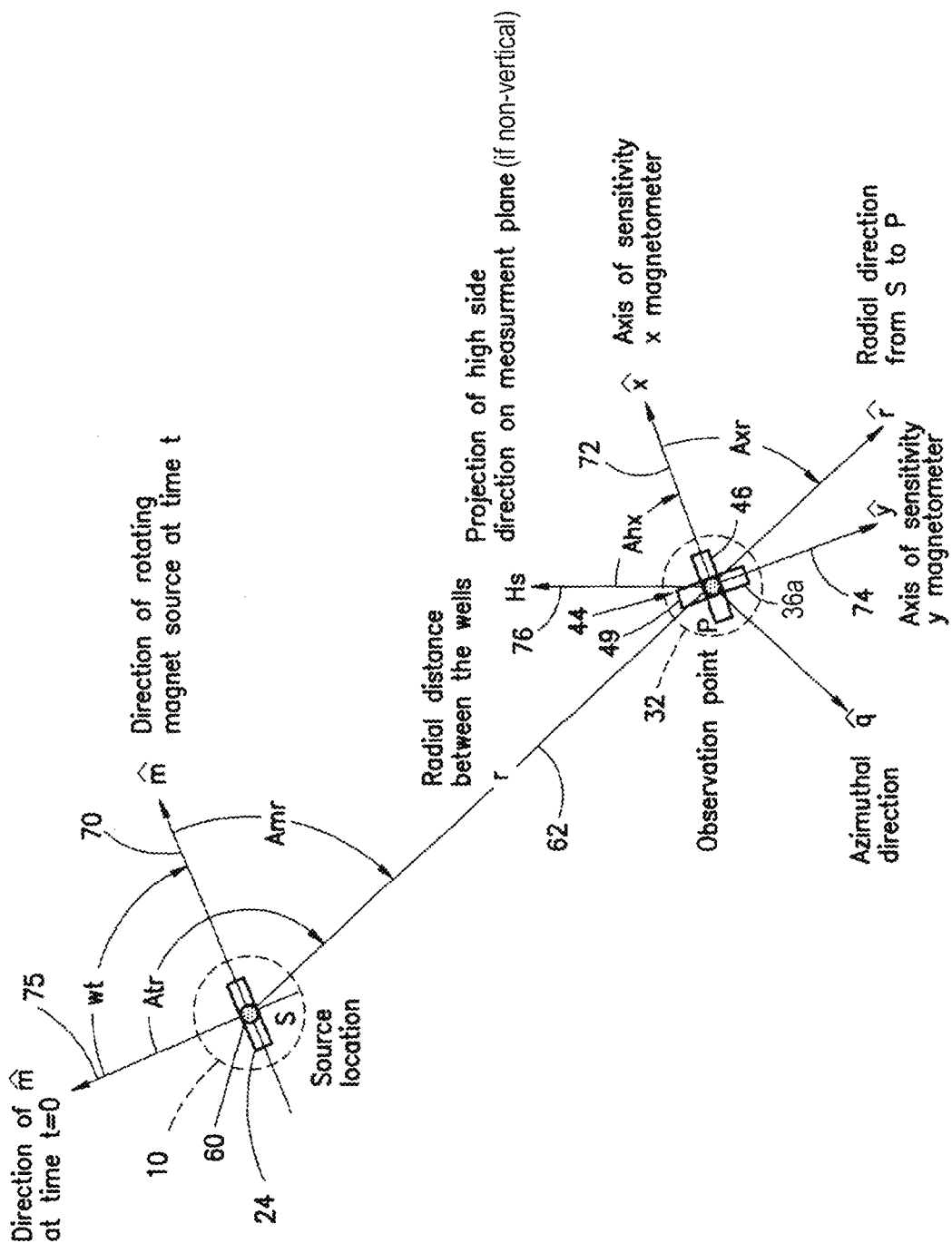
FIG. 5 is a schematic representation illustrating the mathematical analysis of the relationship between the rotating magnetic field source and measurements made at an observation point spaced from the rotating magnetic field source.

FIG. 5 is a schematic representation of the quantities used in evaluating the distance and direction from the observation point to the source. The figure is a sectional view of a plane which is perpendicular to the axis of the drill assembly 14, looking in the direction of drilling second borehole 10, the figure illustrating the various quantities used in the mathematical analysis of the field measurements for determining distance and direction. FIG. 5 illustrates diagrammatically the rotating permanent bar magnet which rotates about source point 60 and axis 17 in a clockwise direction, in the manner described with respect to FIG. 4. Magnet of the magnetic field source 24 is illustrated as having a rotating north-south axis 70. The triaxial sensors 36a-36e located in the previous drilled first borehole 32 at observation points are at right angles to each other, with the axis of sensitivity 72 of triaxial sensor 36a representing the x-axis while the axis 74 of triaxial sensor 36a represents the y-axis in the plane. The radial distance r between source point 60 and observation points is again indicated by radial line 62. The plane of measurement illustrated in FIG. 5 is also perpendicular to the axis of the measuring tool 38. For optimum results, the plane of measurement is at a drilling depth where the triaxial sensor 36a and the rotating magnet of the magnetic field source 24 are coplanar, since both the intensity and the ellipticity of the magnetic field 30 are at their maximum values.

Mathematically, the field of the magnet of the magnetic field source 24 is described by a magnetic dipole pointing in the direction $\hat{m}$ and having a strength of m Weber meters. The N-S axis of dipole 70 rotates at a rate of w radians/second so that the angle of N-S axis 70 with respect to a reference direction 75 at a time t is given by the product wt. The angle Amr denotes the angle between m and the direction of the line 62 from the source point 60 to the observation point p at point 44, line 62 representing the unit radius vector $\hat{r}$.

The axes of the triaxial sensors 36a-36e are indicated by unit direction vector $\hat{x}$, illustrated by line 72, and by unit direction vector $\hat{y}$ illustrated by line 74. The unit direction vector $\hat{z}$ is not shown but points into the page. These three unit vectors are perpendicular to each other and $\hat{x}$ and $\hat{y}$ are perpendicular to the measuring tool 38 which extends through observation point 44. In practice, the magnetic moment plane may not be oriented precisely with the magnetometers as described. Thus, a non-zero reading on the $\hat{z}$ axis magnetometer can occur and this case will be discussed below. It is noted that the magnetic moment can always be mathematically projected onto the $\hat{x}$-$\hat{y}$ plane of the magnetometers using techniques known to those skilled in the art.

The goal of the mathematical analysis is to find the angle Axr (FIG. 5), which is the angle between line 72 representing the unit vector $\hat{x}$, and line 62 representing the unit vector $\hat{r}$. The analysis is also designed to provide the distance r from the measurement of the field component $B_x$ in the $\hat{x}$ direction and from the measurement of the magnetic field component $B_y$ in the $\hat{y}$ direction. This analysis is carried out as follows:

Electromagnetic theory gives the field component $B_r$ in the radial direction $\hat{r}$ and the field component $B_q$ in the azimuthal direction $\hat{q}$ (90° from $\hat{r}$) at the observation point 44 as $$B_r = \frac{m}{4\pi r^3} 2\cos(Amr) = 2M\cos(wt - Atr) \qquad \text{(Eq. 1)}$$

and $$B_q = \frac{m}{4\pi r^3}\sin(Amr) = -M\sin(wt - Atr) \qquad \text{(Eq. 2)}$$

where $$M = \frac{m}{4\pi r^3} \text{ and } Amr = Atr - wt \qquad \text{(Eq. 3)}$$

m being the strength of the magnetic field source and Amr being the angle between the direction of $\hat{m}$ at time t=0 and the direction to the observation point, represented by $\hat{r}$.

Noting FIG. 4, the rules of vector projection give:

$$B_x = B_r \cos(Axr) - B_q \sin(Axr) \qquad \text{(Eq. 4)}$$

$$B_y = B_r \sin(Axr) + B_q \cos(Axr) \qquad \text{(Eq. 5)}$$

Inserting Eqs. 1 and 2 into 3 and 4 and using the trigonometric relationship cos(A+B)=cos(A)cos(B)−sin(A)sin(B), the following is obtained:

$$B_x = M\sqrt{4\cos(Axr)^2 + \sin(Axr)^2}\cos(wt - Atr - P_x) \qquad \text{(Eq. 6)}$$

$$\cos(P_x) = \frac{2\cos(Axr)}{\sqrt{4\cos e(Axr)^2 + \sin(Axr)^2}} \qquad \text{(Eq. 7)}$$

$$\sin(P_x) = \frac{\sin(Axr)}{\sqrt{4\cos(Axr)^2 + \sin(Axr)^2}} \qquad \text{(Eq. 8)}$$

$$B_y = M\sqrt{4\sin(Axr)^2 + \cos(Axr)^2}\cos(wt - Atr - P_y) \qquad \text{(Eq. 9)}$$

$$\cos(P_y) = \frac{2\sin(Axr)}{\sqrt{4\sin(Axr)^2 + \cos(Axr)^2}} \qquad \text{(Eq. 10)}$$

$$\sin(P_y) = \frac{-\cos(Axr)}{\sqrt{4\sin(Axr)^2 + \cos(Axr)^2}} \qquad \text{(Eq. 11)}$$

where $P_x$ and $P_y$ are defined by equations 6 and 9.

Inserting the above values for the sin and cos of $P_x$ and $P_y$ into the trigonometric formulae for $\cos(P_x - P_y)$ and $\sin(P_x - P_y)$, the following is obtained:

$$\sin(2Axr) = +\frac{4\cot(P_x - P_y)}{3} \qquad \text{(Eq. 12)}$$

-continued $$\cos(2Axr) = \frac{5(|B_x|^2 - |B_y|^2)}{3(|B_x|^2 + |B_y|^2)} \quad \text{(Eq. 13)}$$

$$Axr = \frac{\arctan2(\sin(2Axr), \cos(2Axr))}{2} \quad \text{(Eq. 14)}$$

where $|B_x|$ and $|B_y|$ denote the magnitude of $B_x$ and $B_y$ and the function arctan2 is the four quadrant inverse tangent function. The fact that the angle Axr given by relations 12-14 leaves a 180 degree ambiguity in that angle is usually not a problem. Eq. 14 gives the important, and at first sight surprising result, that by measuring the amplitudes $|B_x|$ and $|B_y|$ of the alternating magnetic fields in the $\hat{x}$ and $\hat{y}$ directions, together with the relative phase angle between them ($P_x$-$P_y$), it is possible to determine the angle between the axes of the sensors and the radial line connecting the source and the observation point. This makes it possible to determine the relative direction of the source point 60 with respect to the triaxial sensors. Then, to find the absolute direction to the source, the orientation of the sensors in space is determined by an orientation sensor.

One way to orient the sensors 48 is to determine the direction of the high side (Hs) 76 of the borehole (i.e. upward vertical) in which the sensors are located, and then to determine the angle Ahx, which is the angle between the axis x of the sensor 48, for example, and the direction of the projection of the vertical Hs onto the plane of measurement. Thereafter, once the angle Axr is determined, as discussed above, it can be combined with the angle Ahx using a pair of inclinometers in sensor 50, as is well known by those skilled in the art.

If the borehole is oriented vertically, the concept of the Hs vector is ambiguous. Alternatively, instead of using the vertical, or Hs direction to orient the magnetometers, projections of true North or magnetic North directions onto the plane of measurement can be done, utilizing earth's field sensors, as is well known by those skilled in the art. The angle between true North and $\hat{x}$ is added to angle Axr to obtain an absolute direction to the source. As another alternative, a gyroscope can be used in the sensor 50 to orient the sensors of the sensor array 36.

The distance r between the source point 60 and the observation point 44 is found from the measurements using the relationships derived from Eqs. 1-14 as follows:

$$r = \left(\frac{m}{4\pi}\right)^{1/3} \left(\frac{5}{|B_x|^2 + |B_y|^2}\right)^{1/6} \quad \text{(Eq. 15)}$$

The distance r can be evaluated from Eq. 15, provided that the source strength m is known. Although the value of m can be readily determined at the earth's surface, the effective value of m downhole may be different, particularly if the measuring tool 38 is located within a steel casing, which significantly attenuates the magnetic field. Accordingly, the effective value of m may be determined by moving the measuring tool 38 along the axis of the borehole 32 and measuring the variation of the magnitude of the magnetic field as the relative depths of the sensor and observation point vary. This can be accomplished, for example, by holding the depth of measuring tool 38 fixed and observing the magnetic field signals as drilling progresses (and the location of the magnetic field source moves). The drilling depth corresponding to the point of approach, i.e., when the sensors 36 and the rotating magnetic field source 24 are opposite each other and the observed magnetic field is strongest, as in the considerations above, defines a convenient reference depth for z, i.e., the depth where the parameter z, representing the axial distance from the plane of the sensors to the plane of the source, is 0. As the value of z is varied, the observed value of the magnitude of the field, $B_{mag}$, varies as $$B_{mag} = \sqrt{(|B_x|^2 + |B_y|^2)} = \frac{m}{4\pi r^3} \frac{\sqrt{2\left(\frac{z}{r}\right)^4 - 2\left(\frac{z}{r}\right)^2 + 5}}{\left(1 + \left(\frac{z}{r}\right)^2\right)^{5/2}} \quad \text{(Eq. 16)}$$

Figure 6:
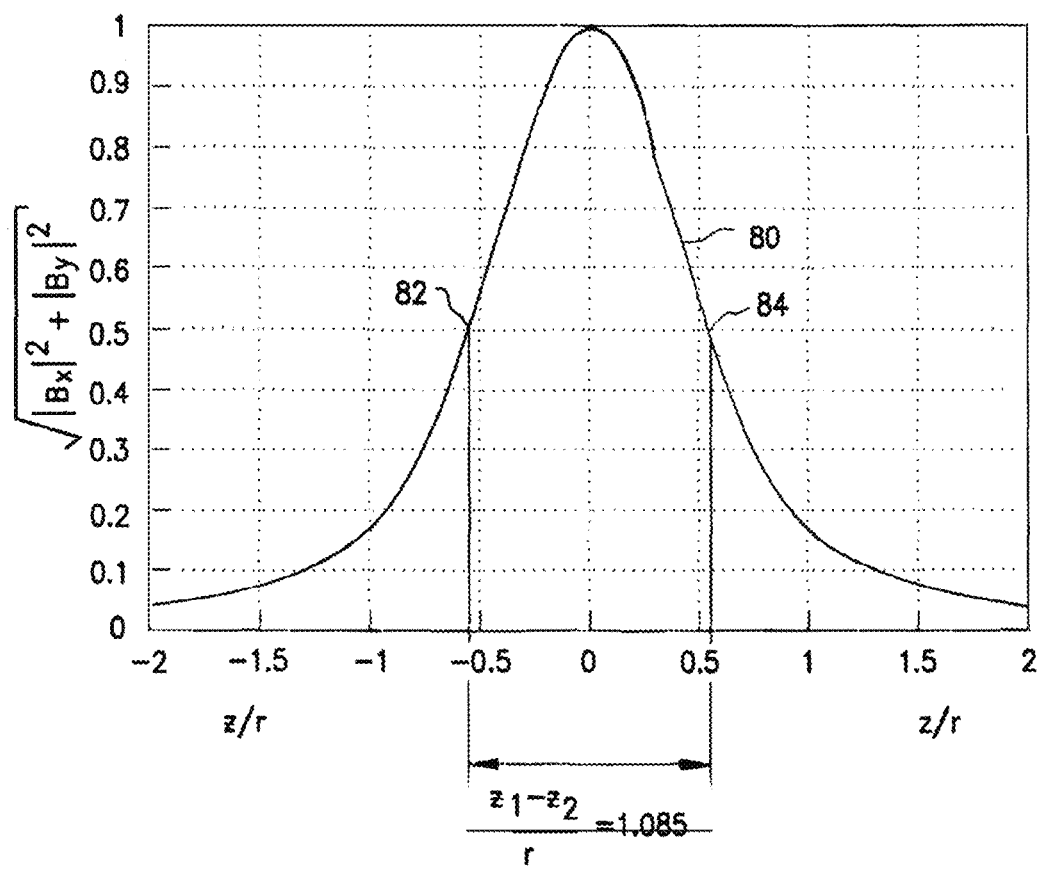
FIG. 6 is a curve illustrating the values of theoretical calculations utilized in a method of the present invention.

The z/r dependence of $B_{mag}$ is illustrated in FIG. 6 by bell-shaped curve 80, which has a characteristic full width at half height which defines a half height parameter $(z_1-z_2)/r=1.085$. The half height points 82 and 84 of the bell-shaped curve generated by a set of observations of $B_{mag}$ vs. depth define a depth interval Dzhh=$(z_1-z_2)$ from which the distance r between the wells is readily found; i.e.

$$r = 1.085 Dzhh \quad \text{(Eq. 17)}$$

Thus, the distance between the wells can be found in a simple way by noting the variation of the total alternating field intensity with depth without knowing the magnitude of the source strength. The value of r thus found and the field magnitude values $|B_x|$ and $|B_y|$ observed at the point of closest approach can then be used in conjunction with Eq. 15 to evaluate the source strength m. Once the source strength is evaluated by this analysis during one interval of drilling, it can usually be used for the entire well.

To apply the above results in practice usually will require some signal averaging, particularly if it is desired to realize the maximum range and precision inherent to the method. This can be done using a commercially available lock-in amplifier. If an electronic lock-in amplifier is used it should include a phase locked loop in the reference channel so that the slowly varying frequency of the signal can be followed. It will usually be more convenient to use digital techniques and to computationally encode the lock-in amplifier functions of frequency locking and signal averaging. Alternatively, one can use well known mathematical methods of signal correction analysis using fast Fourier transforms as discussed in Numerical Recipes in Pascal, by Press, Flannery, Teukolsky and Vetterling, Cambridge University Pres, 1989.

The relationships described above have assumed that the magnetic field source and the field sensor are coplanar, lying in a common plane that is perpendicular to the axes of both the target borehole and the parallel borehole being drilled. However, the accuracy with which the distance and direction from the drill location in the borehole being drilled to the observation point in the target borehole can be determined is significantly improved by taking into account the possibility that the source and the sensor may not be coplanar. This may be accomplished by measuring, at the sensor location, not only the magnetic field components in the x and y directions described above, but also the magnetic field component in the z direction; i.e. the axial field component, and more particularly the axial field gradient.

When the sensors at the observation point are coplanar with the rotating magnetic field source 24, as illustrated in FIG. 4, the axial component of the magnetic field 30 at the measuring point is zero. Thus, by measuring the axial field component at the sensor 36a-36e, it is possible to determine whether the source and the sensor are approximately coplanar. If this component is sufficiently small, the determination of distance and direction will be accurate. Furthermore, measurement of the axial field gradient, as by measuring the difference between the axial fields at two spaced points along the axis, can permit determination of the depths in the respective boreholes where the rotating magnetic field source 24 and the sensor 36a-36e are coplanar. In addition, measurement of such a gradient can permit determination of the radial distance to the magnetic field source 24.

To show these facts quantitatively, consider the mathematical relations which give the axial component of a magnetic field, i.e., Bz at an observation point r, z where r is as shown in FIG. 5, with the observation point at 44. The magnetic field component Bz in the z direction z is given by $$Bz = \frac{3mrz}{4\pi(r^2 + z^2)^{5/2}} \quad \text{(Eq. 18)}$$

and the axial gradient of Bz, i.e., dBz/dz is given by $$dBz/dz = \frac{3mr}{4\pi(r^2 + z^2)^{5/2}}\left(1 - \frac{5z^2}{r^2 + z^2}\right) \quad \text{(Eq. 19)}$$

For z/r<<1, which is often the case, are obtained the dominant terms $$Bx(dBz/dz) = z \quad \text{(Eq. 20)}$$

which finds the depth interval to coplanarity. Again, for z/r<<1:

$$(dBz/dz) = 3m/4\pi r^4 \quad \text{(Eq. 21)}$$

From equation (21) the radial distance of r to the source is determined.

The depth variation, i.e. the z dependence, of the magnetic field ellipticity is another quantity of interest. It is convenient to define this ellipticity parameter in a way which conforms to the linear, circular and elliptical polarization of electromagnetic waves. After noting geometric considerations and equations (1) and (2), the "polarization ellipticity" parameter E of the magnetic field components perpendicular to the axis of rotation of magnet 24 is:

$$E = -2 + (z/r)^2/(1 + (z/r)^2) \quad \text{(Eq. 22)}$$

The physical manifestations of this relation are that for large values of z/r, i.e., at points which are essentially on the axis 60 of magnet rotation, E=1. This corresponds to the magnetic field vector being circularly polarized; it rotates in synchronism and in the same direction as the magnet. At the point where $(z/r)=\sqrt{2}$, then E=0. In this case the magnetic field component perpendicular to the rotation axis 60 in the plane defined by the observation point 44 and the magnet rotation axis 60 goes to zero and the magnetic field vector is linearly polarized, with the direction of polarization being perpendicular to the plane defined by the observation point 44 and the magnet rotation axis 60. Finally, at z/r=0, E=−2, corresponding to the elliptical polarization considered in FIG. 4, the field component in the plane defined by the measuring site 44 and the axis of rotation 60 is double that in the perpendicular direction. The sense of magnetic field rotation in this case is opposite to that of the rotating magnet.

Often the measuring site will be inside a steel casing, as noted above, which because of its large magnetic permeability has the effect of "magnetically shielding" the interior volume of the pipe. This shielding effect is greater on the perpendicular component of the magnetic field than on the axial component. For a 7 inch diameter casing the perpendicular component may be attenuated by a factor of 3 or more whereas the z component may only be attenuated by 20% or 30%. Under these conditions, the axial field component and its gradient not only give a good distance determination but also often can be used advantageously to provide a reference channel for doing correlation analysis or digital lock-in analysis of the smaller perpendicular field components.

Accordingly, it is to be understood that the embodiments of the invention herein described are merely illustrative of the application of the principles of the invention. Reference herein to details of the illustrated embodiments is not intended to limit the scope of the claims, which themselves recite those features regarded as essential to the invention.

What is claimed is:

1. A method for determining a direction from a magnetic field source in a second borehole being drilled relative to at least one previously drilled borehole with a sensor array including a plurality of triaxial sensors, the method comprising the steps of:
receiving continuous magnetic field measurements of the plurality of triaxial sensors of the sensor array in the at least one previously drilled of the magnetic field source in the second borehole being drilled;
determining a strength of the magnetic field source at each of the plurality of triaxial sensors within the sensor array; and
determine a position of the magnetic field source relative to each of the triaxial sensors of the sensor array.

2. The method of claim 1, wherein the triaxial sensors are fluxgate magnetometers and gravity sensors.

3. The method of claim 1, wherein the sensor array is a rigid assembly.

4. The method of claim 1, wherein the magnetic field source is present within a drilling assembly of a drilling machine.

5. The method of claim 4, wherein the magnetic field source is a single, rotating permanent bar magnet.

6. The method of claim 4, wherein the magnetic field source is at least one set of two permanent reciprocating bar magnets.

7. The method of claim 6, wherein a first of the two permanent reciprocating bar magnets is fixed with north-south poles aligned with a drilling axis of the drilling assembly and a second of the two permanent reciprocating bar magnets is mounted to reciprocate with a down the hole hammer of the drilling assembly with north-south poles aligned with the drilling axis of the drilling assembly.

8. The method of claim 7, wherein the north pole of the first of the two permanent reciprocating bar magnets faces the north pole of the second of the two permanent reciprocating bar magnets or the south pole of the first of the two permanent reciprocating bar magnets faces the south pole of the second of the two permanent reciprocating bar magnets.

9. The method of claim 7, wherein the north pole of the first of the two permanent reciprocating bar magnets faces the south pole of the second of the two permanent reciprocating bar magnets or the south pole of the first of the two permanent reciprocating bar magnets faces the north pole of the second of the two permanent reciprocating bar magnets.

10. The method of claim 1, wherein the magnetic field source is a magnetized portion of the drilling assembly.

11. The method of claim 1, wherein the at least one previously drilled borehole comprises a first previously drilled borehole and a second previously drilled borehole.

12. The method of claim 11, wherein the first previously drilled borehole and the second previously drilled borehole each have a sensor array and triangulation of the position of the magnetic field source relative to each of the triaxial sensors of the sensors arrays in each of the first previously drilled borehole and the second previously drilled borehole are used to determine the position of the magnetic field source in the second bore hole being drilled.

13. The method of claim 4, wherein sensor array is coupled to the drilling machine.

14. The method of claim 1, wherein the magnetic field source is an electromagnet.

15. The method of claim 5, wherein the single, rotating permanent bar magnet is comprised of at least one set of multiple bar magnets in parallel.

* * * * *